US012690267B2

(12) United States Patent
Wang et al.

(10) Patent No.: US 12,690,267 B2
(45) Date of Patent: Jul. 21, 2026

(54) DISPLAY SUBSTRATE HAVING INTERLAYER INSULATION LAYER WITH THROUGH HOLE FORMED THEREIN, METHOD FOR MANUFACTURING THE SAME AND DISPLAY PANEL

(71) Applicant: BOE TECHNOLOGY GROUP CO., LTD., Beijing (CN)

(72) Inventors: Lizhong Wang, Beijing (CN); Ce Ning, Beijing (CN); Tianmin Zhou, Beijing (CN); Jinchao Zhang, Beijing (CN); Liping Lei, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 446 days.

(21) Appl. No.: 18/023,966

(22) PCT Filed: Mar. 31, 2022

(86) PCT No.: PCT/CN2022/084564
§ 371 (c)(1),
(2) Date: Feb. 28, 2023

(87) PCT Pub. No.: WO2023/184402
PCT Pub. Date: Oct. 5, 2023

(65) Prior Publication Data
US 2025/0040247 A1      Jan. 30, 2025

(51) Int. Cl.
*H10D 86/60* (2025.01)
*G02F 1/1333* (2006.01)
(Continued)

(52) U.S. Cl.
CPC ....... *H10D 86/60* (2025.01); *G02F 1/133345* (2013.01); *G02F 1/136227* (2013.01);
(Continued)

(58) Field of Classification Search
CPC ............ H10K 59/1213; H10K 59/131; H10D 86/451; H10D 86/021; H10D 86/441;
(Continued)

(56) References Cited

U.S. PATENT DOCUMENTS 5,075,674 A * 12/1991 Katayama ........... G02F 1/13624
345/206
11,823,605 B2 * 11/2023 Tsai ..................... G09G 3/2003
(Continued)

FOREIGN PATENT DOCUMENTS

CN            103094354 A      5/2013
CN            103887328 A      6/2014
(Continued)

OTHER PUBLICATIONS

China Patent Office, OA1 dated Jan. 2, 2025, for corresponding CN application No. 202280000672.5.

*Primary Examiner* — Eva Y Montalvo
(74) *Attorney, Agent, or Firm* — HOUTTEMAN LAW LLC

(57) ABSTRACT

The present disclosure provides a display substrate, a method for manufacturing the display substrate and a display panel. The display substrate includes: a first semiconductor layer on a base substrate, where an active layer of the first thin film transistor is in the first semiconductor layer, and the active layer of the first thin film transistor at least comprises a channel region and a drain contact region; an interlayer insulation layer on a side of the first semiconductor layer away from the base substrate; and a first conductive layer on a side of the interlayer insulation layer away from the first semiconductor layer, wherein the pixel electrode is located in the first conductive layer, and the pixel electrode in the pixel unit is directly and electrically connected to the (Continued)

drain contact region of the active layer of the first thin film transistor through a through hole.

14 Claims, 7 Drawing Sheets

(51) Int. Cl.

| | |
|---|---|
| *G02F 1/1362* | (2006.01) |
| *G02F 1/1368* | (2006.01) |
| *H10D 86/01* | (2026.01) |
| *H10D 86/40* | (2025.01) |
| *H10K 59/121* | (2023.01) |
| *H10K 59/131* | (2023.01) |

(52) U.S. Cl.
CPC ......... *G02F 1/1368* (2013.01); *H10D 86/021* (2025.01); *H10D 86/451* (2025.01); *H10K 59/1213* (2023.02); *H10K 59/131* (2023.02); *H10D 86/441* (2025.01)

(58) Field of Classification Search
CPC .............. H10D 86/60; G02F 1/133345; G02F 1/136227; G02F 1/1368
See application file for complete search history.

(56) References Cited

U.S. PATENT DOCUMENTS

| | | | | |
|---|---|---|---|---|
| 12,328,996 | B2 * | 6/2025 | Diao ................... | H10K 59/131 |
| 12,538,653 | B2 * | 1/2026 | Liu .................... | H10K 59/1213 |
| 2011/0095285 | A1 | 4/2011 | Shu et al. | |
| 2017/0139285 | A1 * | 5/2017 | Lee ................... | G02F 1/136286 |
| 2020/0355956 | A1 * | 11/2020 | Chang ................. | H10D 86/441 |
| 2021/0193045 | A1 * | 6/2021 | Yang ................... | H10K 59/12 |
| 2021/0366941 | A1 * | 11/2021 | Diao ................... | H10D 86/421 |
| 2022/0376024 | A1 * | 11/2022 | Zheng ................ | H10K 59/1213 |
| 2023/0363222 | A1 * | 11/2023 | Shi .......................... | H10K 59/65 |
| 2023/0401990 | A1 * | 12/2023 | Wang ................. | G09G 3/3233 |
| 2024/0049507 | A1 * | 2/2024 | Liu .................... | H10K 59/1213 |
| 2024/0188357 | A1 * | 6/2024 | Liu .................... | H10K 59/1213 |
| 2024/0260320 | A1 * | 8/2024 | Xiao ................. | H10K 59/1213 |
| 2025/0087151 | A1 * | 3/2025 | Wang ................ | H10K 59/1213 |

FOREIGN PATENT DOCUMENTS

| | | |
|---|---|---|
| CN | 104157612 A | 11/2014 |
| CN | 107240590 A | 10/2017 |
| CN | 108417579 A | 8/2018 |
| CN | 108461529 A | 8/2018 |
| CN | 109273404 A | 1/2019 |
| CN | 114236932 A | 3/2022 |

* cited by examiner

DISPLAY SUBSTRATE HAVING INTERLAYER INSULATION LAYER WITH THROUGH HOLE FORMED THEREIN, METHOD FOR MANUFACTURING THE SAME AND DISPLAY PANEL

TECHNICAL FIELD

The present disclosure relates to the field of display technology, and in particular, to a display substrate, a method for manufacturing the display substrate and a display panel.

BACKGROUND

Virtual reality technology is a new technology that seamlessly integrates real world information and virtual world information. As compared with the conventional display products, the most obvious advantage of the virtual reality display products is the ultrahigh resolution. With the development of the electro-optical technology and the semiconductor manufacturing technology, in the display devices, for example, Thin Film Transistor Liquid Crystal Display (TFT-LCD) is dominant in the current market of the display devices due to its advantages such as high-quality image, high space utilization, low power consumption, no radiation, etc. At present, the resolution of virtual reality LCD product in the market is very high, but its display effect still cannot meet customers' needs.

SUMMARY

The present disclosure aims to solve at least one technical problem in the prior art and provides a display substrate, a method for manufacturing a display substrate and a display panel.

As a first aspect, an embodiment of the present disclosure provides a display substrate having a display region, wherein the display substrate includes: a base substrate; and a plurality of pixel units in the display region on the base substrate, wherein each of the plurality pixel units includes a first thin film transistor and a pixel electrode; wherein the display substrate includes a first semiconductor layer on the base substrate, wherein an active layer of the first thin film transistor is in the first semiconductor layer, and the active layer of the first thin film transistor at least includes a channel region and a drain contact region; an interlayer insulation layer on a side of the first semiconductor layer away from the base substrate; and a first conductive layer on a side of the interlayer insulation layer away from the first semiconductor layer, wherein the pixel electrode is located in the first conductive layer, and the pixel electrode in the pixel unit is directly and electrically connected to the drain contact region of the active layer of the first thin film transistor through a through hole penetrating through the interlayer insulation layer.

Optionally, the interlayer insulation layer includes a first insulation layer and a second insulation layer disposed in sequence on a side of the first semiconductor layer away from the base substrate, the through hole includes a first through hole penetrating the second insulation layer and a second through hole penetrating the first insulation layer; and the pixel electrode in the pixel unit is directly and electrically connected to the drain contact region of the active layer of the first thin film transistor through the first through hole and the second through hole.

Optionally, an orthographic projection of the first through hole on the base substrate overlaps an orthographic projection of the second through hole on the base substrate.

Optionally, the display substrate further includes a third insulation layer including a filling structure and a support structure, wherein the filling structure is in the first through hole; and the support structure is on a side of the second insulation layer away from the base substrate.

Optionally, the display substrate further includes a second conductive layer and a third conductive layer, wherein the first insulation layer includes a first insulation sub-layer, a second insulation sub-layer, and a third insulation sub-layer, the first insulation sub-layer is on a side of the first semiconductor layer away from the base substrate, the second conductive layer is on a side of the first insulation sub-layer away from the base substrate and includes a gate line and a gate electrode of the first thin film transistor, the second insulation sub-layer is on a side of the second conductive layer away from the base substrate, the third conductive layer is on a side of the second insulation sub-layer away from the base substrate and includes a data line and a source electrode of the first thin film transistor, and the third insulation sub-layer is on a side of the third conductive layer away from the base substrate.

Optionally, the data line includes a plurality of data line segments sequentially connected together, each of the plurality of data line segments includes a first signal line sub-segment extending along a first direction, a second signal line sub-segment extending along a second direction, and a third signal line sub-segment extending along a third direction, with the first direction, the second direction, and the third direction different from each other, the first signal line sub-segment, the second signal line sub-segment and the third signal line sub-segment are sequentially connected together, the second signal line sub-segment and the third signal line sub-segment are connected to each other to form a first included angle therebetween, and the second signal line sub-segment and the third signal line sub-segment are located between two adjacent gate lines.

Optionally, the first included angle is greater than or equal to 90° and less than 180°.

Optionally, the active layer of the first thin film transistor includes a first semiconductor structure extending along a fourth direction and a second semiconductor structure extending along a fifth direction, and an orthographic projection of the first through hole on the base substrate overlaps an orthographic projection of the second semiconductor structure on the base substrate.

Optionally, an orthographic projection of the first signal line sub-segment on the base substrate at least partially overlaps an orthographic projection of the first semiconductor structure on the base substrate.

Optionally, the first semiconductor structure and the second semiconductor structure form a second angle therebetween, with the second angle being greater than or equal to 90° and less than 180°.

Optionally, the pixel electrode includes a first pixel sub-electrode and a second pixel sub-electrode electrically connected to the first pixel sub-electrode, the first pixel sub-electrode includes a first portion and a second portion, wherein the first portion is in the first through hole and covers a sidewall and a bottom of the first through hole, and the second portion is filled in the second through hole and is connected to the drain contact region of the first thin film transistor, the second pixel sub-electrode is on a side of the support structure away from the base substrate and is connected to the first portion of the first pixel sub-electrode.

Optionally, the display substrate further includes a fourth insulation layer, a fifth insulation layer, and a fourth conductive layer disposed between the first semiconductor layer and the base substrate; wherein the fifth insulation layer is on a side of the first semiconductor layer proximal to the base substrate, the fourth conductive layer is on a side of the fifth insulation layer proximal to the base substrate, the fourth conductive layer includes a light shielding layer, and an orthographic projection of the light shielding layer on the base substrate covers an orthographic projection of the channel region of the first semiconductor layer on the base substrate, and the fourth insulation layer is on a side of the fourth conductive layer proximal to the base substrate.

Optionally, the display substrate further has a non-display region, and further includes a gate driving circuit in the non-display region on the base substrate, and the gate driving circuit includes a second thin film transistor, and a gate electrode of the second thin film transistor is in the fourth conductive layer.

Optionally, the display substrate further includes a sixth insulation layer on a side of the first conductive layer away from the base substrate, and a common electrode on a side of the sixth insulation layer away from the base substrate, wherein an orthographic projection of the common electrode on the base substrate overlaps an orthographic projection of the pixel electrode on the base substrate.

Optionally, a material of the active layer of the first thin film transistor includes an oxide semiconductor.

As a second aspect, an embodiment of the present disclosure provides a method for manufacturing a display substrate, wherein the display substrate includes a plurality of pixel units in a display region, and each of the plurality of pixel units includes a first thin film transistor, and the method includes: providing a base substrate; forming a first semiconductor layer on the base substrate, wherein the first semiconductor layer includes an active layer of the first thin film transistor, and the active layer of the first thin film transistor at least includes a channel region and a drain contact region; forming an interlayer insulation layer on a side of the first semiconductor layer away from the base substrate; and forming a through hole in the interlayer insulation layer through a patterning process, and forming a first conductive layer on a side of the interlayer insulation layer away from the first semiconductor layer, wherein the first conductive layer includes a pixel electrode directly and electrically connected to the drain contact region of the active layer of the first thin film transistor through the through hole penetrating through the interlayer insulation layer.

As a third aspect, an embodiment of the present disclosure provides a display panel including the display substrate described above.

BRIEF DESCRIPTION OF DRAWINGS

The accompanying drawings, which facilitate a further understanding of the present disclosure and constitute a part of the specification, are used in conjunction with the following specific embodiments to explain the present disclosure, but are not intended to limit the present disclosure. In the drawings:

FIG. 3b is a schematic diagram showing a portion of a data line of the display substrate shown in FIG. 3a;

FIG. 3c is a schematic diagram of a portion of an active layer of the display substrate shown in FIG. 3a;

FIG. 3d is a schematic diagram showing an overlapping between a data line and an active layer of the display substrate shown in FIG. 3a;

DETAIL DESCRIPTION OF EMBODIMENTS

In order to enable those skilled in the art to better understand the technical solutions of the present disclosure, the present disclosure will be further described in detail below in conjunction with the drawings and specific embodiments.

Unless defined otherwise, technical or scientific terms used herein shall have the ordinary meaning as understood by one of ordinary skill in the art to which this disclosure belongs. The use of "first", "second", and the like in the present disclosure is not intended to indicate any order, quantity, or importance, but rather serves to distinguish one element from another. Also, the term "a", "an", "the" or the like does not denote a limitation of quantity, but rather denotes the presence of at least one. The word "include", "comprise", or the like means that the element or item preceding the word includes the element or item listed after the word and its equivalent, but does not exclude other elements or items. The term "connect", "couple" or the like is not restricted to physical or mechanical connections, but may include electrical connections, whether direct or indirect. The terms "upper", "lower", "left", "right", and the like are used only to indicate relative positional relationships, and when the absolute position of the object being described is changed, the relative positional relationships may also be changed accordingly.

It should be noted that in the embodiment of the present disclosure, "patterning process" refers to steps for forming a structure having a specific pattern, for example, a photolithography process including one or more steps of forming a material layer, coating a photoresist, exposing, developing, etching, stripping the photoresist, and the like. Alternatively, the patterning process may be other processes, such as an imprinting process and an inkjet printing process.

Figure 1:
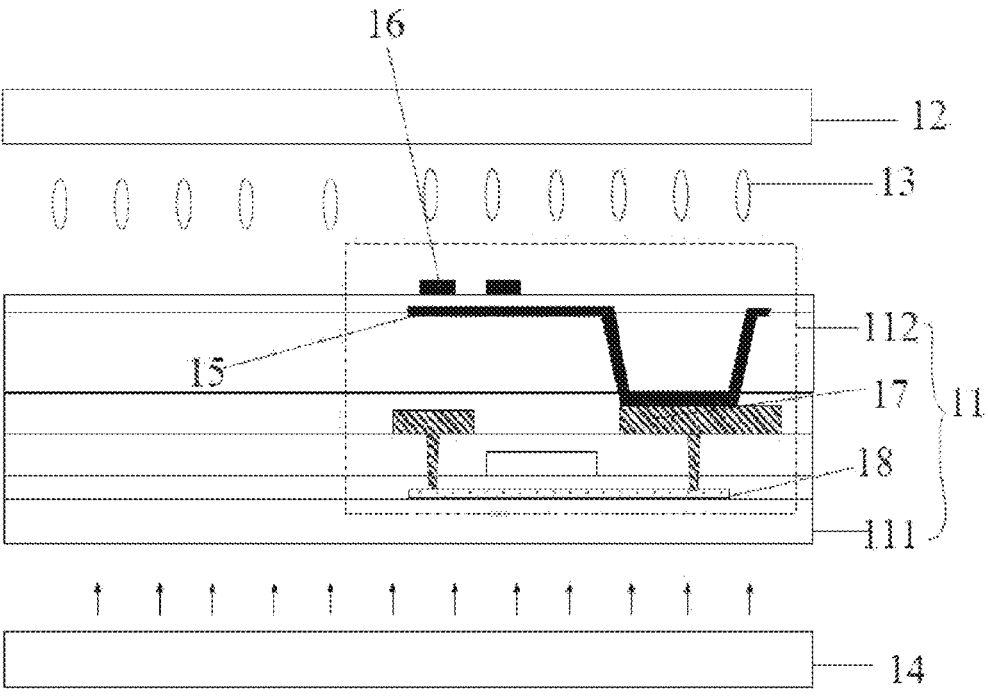
FIG. 1 is a schematic diagram showing a structure of an exemplary field sequential display panel.

In the liquid crystal display device displaying with the field sequential display method, RGB LEDs are arranged in each of a plurality of pixel units, instead of dividing each of the pixel units into RGB three sub-pixels. The liquid crystal molecules corresponding to the pixel units are controlled to deflect the preset angled in a time-sharing manner, and the RGB LEDs are controlled to emit light in three-primary colors RGB in a time-sharing manner passing through the liquid crystal, so that the pixel units display corresponding color values in a frame. FIG. 1 is a schematic diagram showing a structure of an exemplary field sequential display panel. As shown in FIG. 1, the display panel includes a display substrate 11, a counter substrate 12, and a liquid crystal layer 13 located between the display substrate 11 and the counter substrate 12. The display substrate 11 may include a plurality of pixel units 112 on a base substrate 111, and each of the pixel units 112 includes a thin film transistor (TFT) 112. In addition, the field sequential display panel may further include an OLED light source 14 disposed on a side of the base substrate 111 away from the thin film transistor TFT for providing light in three-primary colors to the pixel units 112.

The OLED light source 14 may include: a plurality of three-primary-color light source groups each of which includes a first sub-lightsource emitting light in a first color, a second sub-lightsource emitting light in a second color, and a third sub-lightsource emitting light in a third color. Each of the first sub-lightsource, the second sub-lightsource, and the third sub-lightsource may include an anode, a cathode, and a light emitting layer between the anode and the cathode. It should be noted that the first, second, and third colors may be red, green, and blue, respectively, however the embodiment of the present invention is not limited thereto, and the first, second, and third colors may be may be other three primary colors, such as cyan, magenta, and yellow. Each of the sub-lightsources may include an electron transport layer and a hole transport layer in addition to the light emitting layer for emitting light in a corresponding color. In order to improve the injection efficiency of injecting electrons and holes into the light emitting layer, each of the sub-lightsources may further include an electron injection layer disposed between the cathode and the electron transport layer, and a hole injection layer disposed between the anode and the hole transport layer.

Each of the pixel units 112 of the display substrate includes a thin film transistor, a pixel electrode 15, and a common electrode 16, but does not include a color filter layer. As shown in FIG. 1, the pixel electrode 15 is electrically connected to a semiconductor active layer 18 of the thin film transistor through the transition electrode 17. However, when the pixel electrode 15 is connected to the transition electrode 17, an abnormal contact resistance tends to occur.

In order to solve at least one of the above technical problems, embodiments of the present disclosure provide a display substrate, a method for manufacturing the display substrate, and a display panel. The display substrate, the method for manufacturing the display substrate, and the display panel in embodiments of the present disclosure will be described in further detail with reference to the accompanying drawings and the detailed description.

As a first aspect, an embodiment of the present disclosure provides a display substrate having a display region. The display substrate includes a base substrate and a plurality of pixel units disposed on the base substrate and located in the display region. each of the pixel units includes a first thin film transistor and a pixel electrode. The display substrate includes a first semiconductor layer, an interlayer insulation layer and a first conductive layer.

Specifically, the first semiconductor layer is disposed on the base substrate, the active layer of the first thin film transistor is located in the first semiconductor layer, and the active layer of the first thin film transistor at least includes a channel region and a drain contact region. The interlayer insulation layer is disposed on a side of the first semiconductor layer away from the base substrate. The first conductive layer is disposed on a side of the interlayer insulation layer away from the first semiconductor layer. The pixel electrode is positioned in the first conductive layer, and the pixel electrode in the pixel unit is directly and electrically connected to a drain contact region of the active layer of the first thin film transistor through a through hole penetrating through the interlayer insulation layer.

As compared with the prior art in which the pixel electrode is electrically connected to the active layer of the first thin film transistor through the transition electrode, in the embodiment in which the pixel electrode is directly and electrically connected to the drain contact region of the active layer of the first thin film transistor through the through hole penetrating through the interlayer insulation layer, the preparation of the transition electrode can be omitted, the process steps can be simplified, and the abnormal contact resistance tending to occur when the pixel electrode is connected to the transition electrode can be avoided.

it should be noted that the type of the first thin film transistor can be selected as needed. For example, the first thin film transistor may be a top-gate thin film transistor, a double-gate thin film transistor, a bottom-gate thin film transistor, or the like. In the following description, a top-gate thin film transistor as the first thin film transistor will be described as an example.

Figure 2:
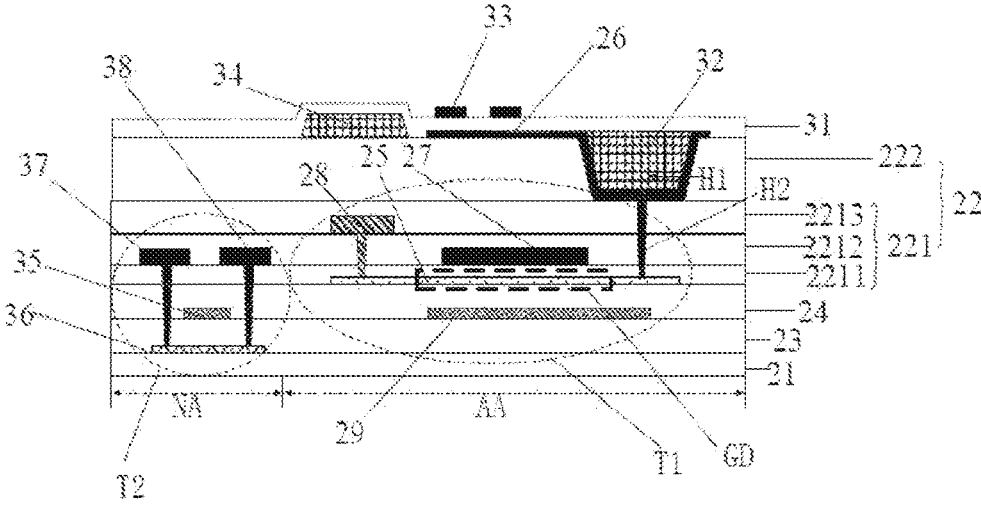
FIG. 2 is a schematic cross-sectional view of a display substrate according to an embodiment of the present disclosure.

FIG. 2 is a schematic cross-sectional view showing a display substrate according to an embodiment of the present disclosure. As shown in FIG. 2, the display substrate has a display region AA and a non-display region NA. The display substrate includes a base substrate 21 and a plurality of pixel units on the base substrate 21, and each of the plurality of pixel units includes at least one first thin film transistor T1.

Specifically, as shown in FIG. 2, the display substrate includes a base substrate 21, a first semiconductor layer 25, an interlayer insulation layer 22, and a first conductive layer 26. The first semiconductor layer 25 is disposed on the base substrate 21. An active layer of the first thin film transistor is disposed in the first semiconductor layer 25 and at least includes a channel region GD and a drain contact region. The interlayer insulation layer 22 includes a first insulation layer 221 disposed on a side of the active layer 25 of the first thin film transistor T1 away from the base substrate 21, and a second insulation layer 222 disposed on a side of the first insulation layer 221 away from the base substrate 21. The first conductive layer is disposed on a side of the second insulation layer 222 away from the active layer 25 of the first thin film transistor. The pixel electrode 26 is located in the first conductive layer, and the pixel electrode 26 in the pixel unit is directly and electrically connected to the drain contact region of the active layer 25 of the first thin film transistor through a first through hole H1 penetrating through the second insulation layer 222 and a second through hole H2 penetrating through the first insulation layer 221. An orthographic projection of the first through hole H1 on the base substrate covers an orthographic projection of the second through hole H2 on the base substrate.

The base substrate 21 may be a flexible substrate to improve the flexibility of the display substrate, so that the display substrate may be flexible or bendable, and the like, so as to expand the application range of the display substrate. However, the base substrate is not limited thereto, the base substrate 21 may alternatively be rigid. Specifically, the performance of the base substrate may be determined according to the actual requirements on the display product. The base substrate 21 may have a single-layer structure or a multi-layer structure. For example, the base substrate may include a plurality of film layers, such as a polyimide layer, a buffer layer, and a polyimide layer stacked sequentially. The buffer layer may be made of silicon nitride, silicon oxide, or other materials, so as to block water, oxygen, and alkali ions. It should be noted that the structure of the base substrate is not limited thereto and may be determined according to actual requirements.

Each of the first insulation layer 221 and the second insulation layer 222 may have a single-layer structure or a multi-layer structure, which is not limited herein. The materials of the first insulation layer 221 and the second insulation layer 222 include but not limited to, silicon oxide (SiOx), silicon nitride (SiNx), hafnium oxide (HfOx), silicon oxynitride (SiON), aluminum oxide (AlOx), or the like, or a multilayer film composed of two or three of the materials described above.

The first conductive layer may have a single-layer structure or a multi-layer structure, which is not limited herein. The first conductive layer may be made of an inorganic metal oxide (e.g., ITO, ZnO, etc.), an organic conductive polymer (e.g., poly-3,4-ethylenedioxythiophene/polystyrene sulfonate PEDOT: PSS, polyaniline PANI, etc.), or a metal material with a high work function (e.g., gold, copper, silver, platinum, etc.).

The material of the first semiconductor layer (i.e., the material of the active layer of the first thin film transistor) may be selected according to circumstances. For example, the material of the first semiconductor layer includes but not limited to, polysilicon, amorphous silicon, an oxide semiconductor, or the like.

As compared with the prior art in which the pixel electrode is electrically connected to the active layer of the first thin film transistor through the transition electrode, in the embodiment in which the pixel electrode 26 is directly and electrically connected to the drain contact region of the active layer 25 of the first thin film transistor T1 through the first through hole H1 penetrating through the second insulation layer 222 and the second through hole H2 penetrating through the first insulation layer 221, the preparation of the transition electrode can be omitted, the process steps can be simplified, and the abnormal contact resistance tending to occur when the pixel electrode is connected to the transition electrode can be avoided.

In some embodiments, as shown in FIG. 2, the display substrate further includes a third insulation layer including a filling structure 32 and a support structure 34. The filling structure 32 is disposed in the first through hole H1, and a first surface of the filling structure 32 and a surface of the second insulation layer 222 away from the base substrate 21 are located in the same plane. That is, the filling structure 32 fills the first through hole H1, so that an upper surface of the filled first through hole H1 is planarized. As shown in FIG. 2, the support structure 34 is disposed on a side of the second insulation layer 222 away from the base substrate 21. Optionally, the material of the third insulation layer includes but not limited to, acrylic, transparent resin, or the like.

In the present embodiment, the filling structure 32 and the support structure 34 may be formed by one patterning process, so that the process steps can be simplified, and the manufacturing cost can be reduced. The support structure 34 serves as a pillar spacer PS supporting the counter substrate 12. The shape of the support structure 34 may be selected according to circumstances, which is not limited herein, and preferably, the support structure 34 has a block shape.

In some embodiments, as shown in FIG. 2, the display substrate further includes a second conductive layer 27 and a third conductive layer 28. The first insulation layer 221 includes a first insulation sub-layer 2211, a second insulation sub-layer 2212, and a third insulation sub-layer 2213. Specifically, the first insulation sub-layer 2211 is disposed on a side of the first semiconductor layer 25 away from the base substrate 21. The second conductive layer 27 is disposed on a side of the first insulation sub-layer 2211 away from the base substrate 21. The second insulation sub-layer 2212 is disposed on a side of the second conductive layer 27 away from the base substrate 21. The third conductive layer 28 is disposed on a side of the second insulation sub-layer 2212 away from the base substrate 21. The third insulation sub-layer 2213 is disposed on a side of the third conductive layer 28 away from the base substrate 21. The second conductive layer 27 includes a gate line (not shown) on the base substrate 21 and a gate electrode of the first thin film transistor T1. The third conductive layer 28 includes a data line (not shown) on the base substrate 21 and a source electrode of the first thin film transistor T1.

The material of the second conductive layer 27 may be a single-layer or multi-layer composite stacked layers formed of one or more of molybdenum (Mo), molybdenum-niobium alloy (MoNb), aluminum (Al), aluminum-neodymium alloy (AlNd), titanium (Ti), and copper (Cu), and is preferably a single-layer or multi-layer composite film formed of Mo, Al, or an alloy containing Mo and Al. The material of the third conductive layer 28 may be made of inorganic metal oxide (e.g., indium tin oxide ITO, zinc oxide ZnO, etc.), organic conductive polymer (e.g., poly 3,4-ethylenedioxythiophene/polystyrene sulfonate PEDOT: PSS, polyaniline PANI, etc.), or a metal material with a high work function (e.g., gold, copper, silver, platinum, etc.).

it should be noted that the number of layers in the first insulation layer 221 may be selected according to circumstances, which is not limited herein. The embodiment in which the first insulation layer 221 has a three-layer structure is taken as an example.

As compared with the prior art in which the pixel electrode is electrically connected to the active layer of the first thin film transistor through the transition electrode, in the embodiment in which the pixel electrode 26 is connected to the drain contact region of the active layer 25 of the first thin film transistor T1 through the first through hole H1 penetrating through the second insulation layer 222 and the second through hole H2 penetrating through the first insulation sub-layer 2211, the second insulation sub-layer 2212, and the third insulation sub-layer 2213, the preparation of the transition electrode can be omitted, the process steps can be simplified, and the abnormal contact resistance tending to occur when the pixel electrode is connected to the transition electrode can be avoided.

Figure 3A:
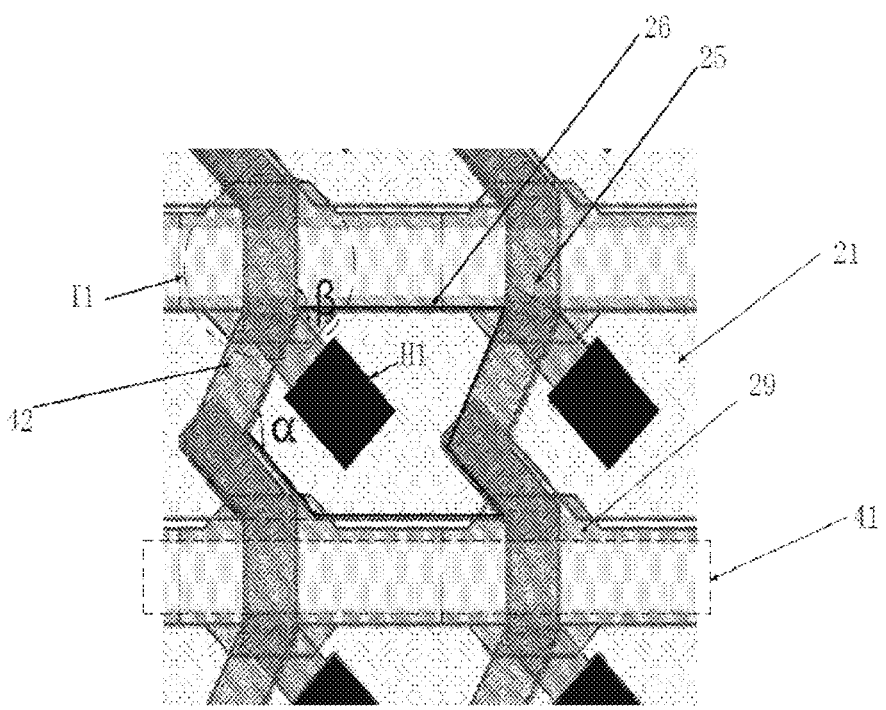
FIG. 3a is a layout of a display substrate according to an embodiment of the present disclosure.
Figure 3B:
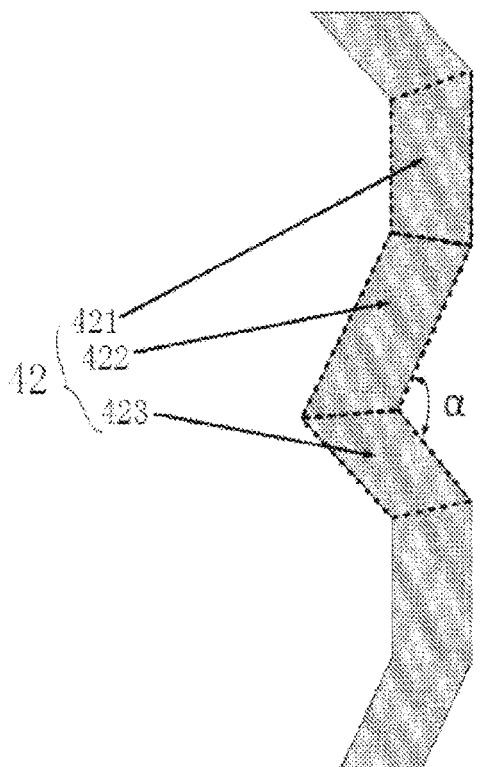
Figure 3C:
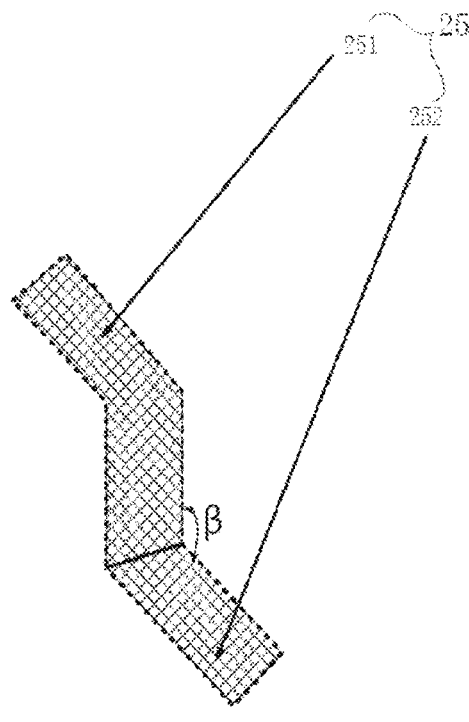
Figure 3D:
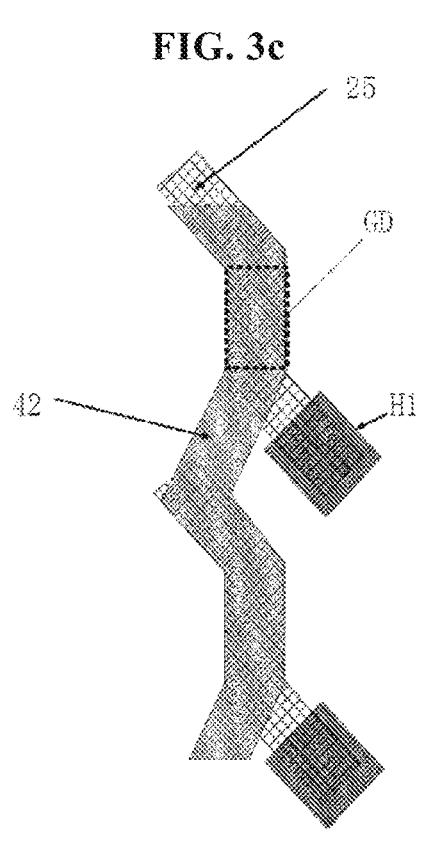
Figure 4:
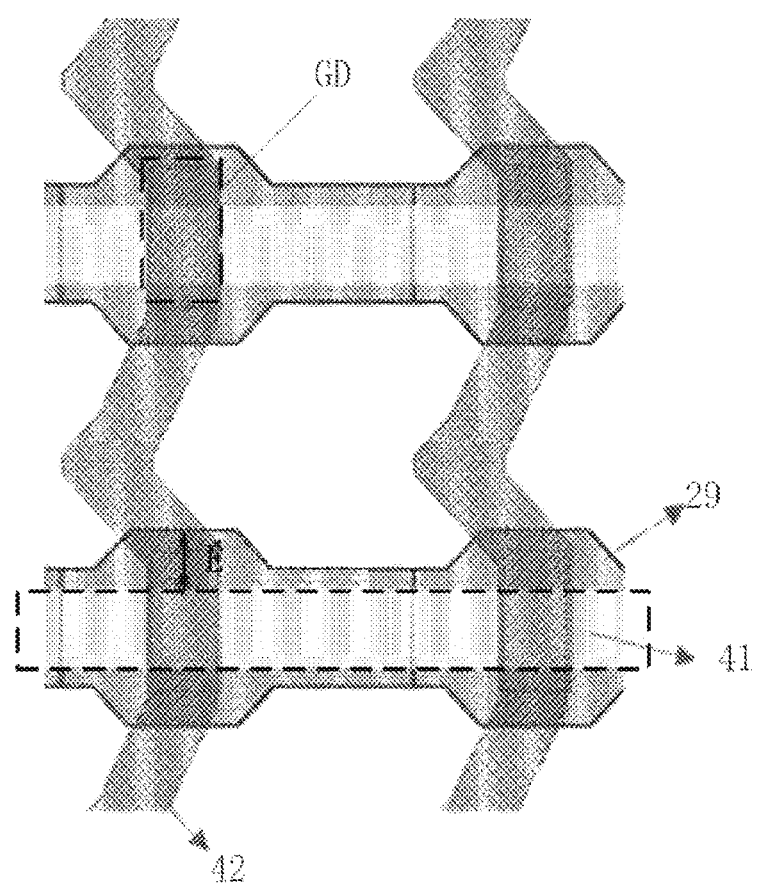
FIG. 4 shows an enlarged layout of a portion of a display substrate according to an embodiment of the present disclosure.

FIG. 3a is a layout of a display substrate according to an embodiment of the present disclosure, and FIG. 3b is a schematic diagram showing a portion of a data line of the display substrate shown in FIG. 3a; FIG. 3c is a schematic diagram showing a portion of an active layer of the display substrate shown in FIG. 3a; FIG. 3d is a schematic diagram showing an overlapping between a data line and an active layer of the display substrate of FIG. 3a; and FIG. 4 shows an enlarged layout of a portion of a display substrate according to an embodiment of the present disclosure. As shown in FIGS. 3a, 3b, 3c, 3d, and 4, gate lines 41 and data lines 42 are further disposed on the base substrate 21, each of the data lines 42 on the base substrate 21 includes a plurality of data line segments connected together in sequence, and each of the data line segments includes a first signal line sub-segment 421 extending along a first direction, a second signal line sub-segment 422 extending along a second direction, and a third signal line sub-segment 423 extending along a third direction. The first direction, the second direction and the third direction are different from each other, and a certain included angle is formed between the three directions.

The first signal line sub-segment 421, the second signal line sub-segment 422, and the third signal line sub-segment 423 are connected together in sequence. The second signal line sub-segment 422 and the third signal line sub-segment 423 form a first included angle α therebetween, and the second signal line sub-segment 422 and the third signal line sub-segment 423 are located between two adjacent ones of the gate lines 41. It should be noted that a first included angle α formed between the second signal line sub-segment 422 and the third signal line sub-segment 423 may be set according to actual situations, which is not limited herein. Preferably, the first included angle α is greater than or equal to 90° and less than 180°.

The active layer 25 of the first thin film transistor includes a first semiconductor structure 251 extending in a fourth direction (i.e., the first semiconductor structure extends along the same direction as the first signal line sub-segment 421), and a second semiconductor structure 252 extending in a fifth direction. An orthographic projection of the first signal line sub-segment 421 on the base substrate 21 at least partially overlaps an orthographic projection of the first semiconductor structure 251 on the base substrate, and an orthographic projection of the first through hole H1 on the base substrate at least partially overlaps an orthographic projection of the second semiconductor structure 252 on the base substrate 21. The first semiconductor structure 251 and the second semiconductor structure 252 form a second included angle β therebetween, and the second included angle β may be set according to actual situations, which is not limited herein. Preferably, the second included angle β is greater than or equal to 90° and less than 180°. The fourth direction intersects the fifth direction. It should be noted that, in the embodiment in which the first direction and the fourth direction are the same direction is taken as an example, however the fourth direction and the first direction may alternativley be different directions, which is not limited herein.

In the present embodiment, the bent data line 42 and the bent active layer 25 of the first thin film transistor T1 are formed, so that the aperture of the pixel unit can be increased, and the Pixels Per Inch (PPI) of the display substrate can be improved.

As shown in FIG. 4, in order to further improve the PPI, the channel region GD of the active layer 25 of the first thin film transistor T1 is located at an overlapping position where the gate line 41 overlaps the data line 42. Simultaneously, in order to improve the performance of the first thin film transistor T1, the light shielding layer 29 in the channel region GD is widened, with a widening dimension E of 0 to 5 μm.

In some embodiments, as shown in FIG. 2, the display substrate further includes a sixth insulation layer 31 and a common electrode 33. Specifically, the sixth insulation layer 31 is disposed on a side of the pixel electrode 26 away from the base substrate 21, the common electrode 33 is disposed on a side of the sixth insulation layer 31 away from the base substrate 21, and an orthographic projection of the common electrode 33 on the base substrate 21 overlaps an orthographic projection of the pixel electrode 26 on the base substrate 21. During the operation process of the display panel, the pixel electrode 26 and the common electrode 33 are applied with voltages to generate an electric field therebeween to control the deflection of the liquid crystal, thereby realizing the display function of the display panel.

However, in the display substrate in FIG. 2, since the pixel electrode 26 does not cover the filling structure 32, the electric field for driving the liquid crystal in a region corresponding to the filling structure 32 may not be uniform.

Figure 5:
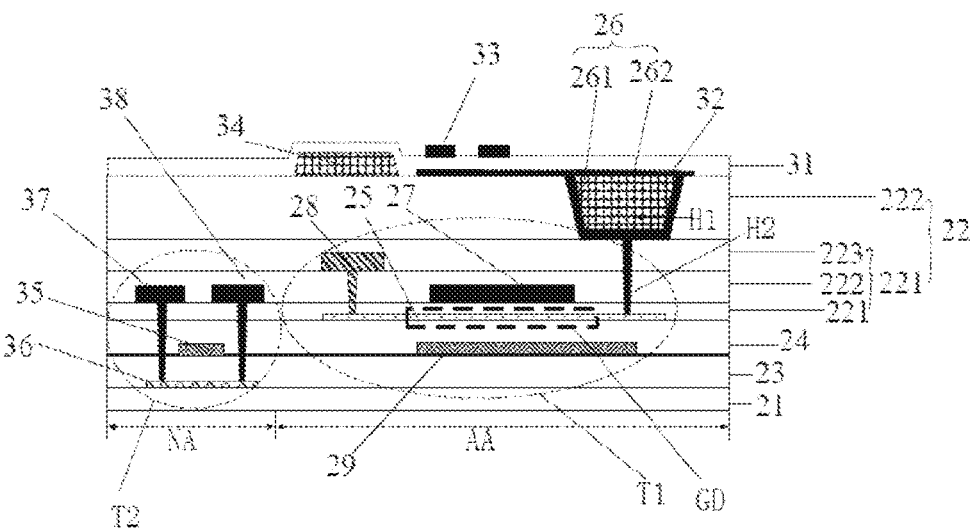
FIG. 5 is a schematic cross-sectional view of a display substrate according to another embodiment of the present disclosure.

FIG. 5 is a schematic diagram showing a structure of a display substrate according to another embodiment of the present disclosure. As shown in FIG. 5, the pixel electrode 26 includes a first pixel sub-electrode 261 and a second pixel sub-electrode 262 electrically connected to the first pixel sub-electrode 261. The first pixel sub-electrode 261 includes a first portion and a second portion, wherein first portion is located in the first through hole H1 and covers sidewalls and bottom of the first through hole H1, and the second portion is filled within the second through hole H2 and connected to the drain contact region of the first thin film transistor T1. The second pixel sub-electrode 262 is located on a side of the second insulation layer 222 away from the base substrate 21 and is connected to the first portion of the first pixel sub-electrode 261.

The common electrode 33 is made of any one of an ITO (indium tin oxide)/Ag (silver)/ITO (indium tin oxide) structure or a Ag (silver)/ITO (indium tin oxide) structure. Alternatively, the ITO in the above structure is replaced with any one of IZO (indium zinc oxide), IGZO (indium gallium zinc oxide), or InGaSnO (indium gallium tin oxide). In the embodiment, the material of the pixel electrode is preferably ITO (indium tin oxide).

In the embodiment, since the first pixel sub-electrode 261 is in the first through hole H1 and the second through hole H2, and the second pixel sub-electrode 261 is located on a side of the filling structure 32 away from the base substrate 21, it can be ensured that the non-uniformity of the electric field for driving the liquid crystal in a pixel region corresponding to the filling structure 32 does not occur, thereby improving the display effect.

In some embodiments, as shown in FIG. 2 and FIG. 5, the display substrate further includes a fourth insulation layer 23, a fifth insulation layer 24, and a fourth conductive layer 29 that are disposed between the first semiconductor layer 25 and the base substrate 21. Specifically, the fifth insulation layer 24 is located on a side of the first semiconductor layer 25 proximal to the base substrate 21. The fourth conductive layer 29 is located on a side of the fifth insulation layer 24 proximal to the base substrate 21. The fourth insulation layer 23 is located on a side of the fourth conductive layer 29 proximal to the base substrate 21.

The fourth conductive layer 29 includes a light shielding layer, and an orthographic projection of the light shielding layer on the base substrate 21 covers an orthographic projection of the channel region GD of the first semiconductor layer 25 on the base substrate 21.

In the embodiment, the light shielding layer 29 is formed on a side of the active layer 25 of the first thin film transistor T1 proximal to the base substrate 21, so that light emitted from the backlight can be prevented from being irradiated to the active layer 25 of the first thin film transistor T1, thereby preventing the performance of the first thin film transistor T1 from being affected, and preventing abnormal display of the display panel. The light shielding layer 29 may be made of a material having light shielding and conductive properties, such as copper, molybdenum, or the like, which is not limited in the embodiment of the present disclosure.

In some embodiments, as shown in FIG. 2 and FIG. 5, the display substrate further has a non-display region NA. The display substrate further includes a gate driving circuit disposed in the non-display region NA on the base substrate 21. The gate driving circuit includes a second thin film transistor T2. The second thin film transistor T2 includes a gate electrode 35, an active layer 36, a source electrode 37, and a drain electrode 38. The gate electrode 35 of the second thin film transistor T2 is located in the fourth conductive layer, that is, the gate electrode of the second thin film transistor T2 and the light shielding layer 29 are located in the same layer and made of the same material. The source electrode 37 and the drain electrode 38 of the second thin film transistor T2 are located in the second conductive layer, that is, the source electrode 37 and the drain electrode 38 of the second thin film transistor T2 are located in the same layer and made of the same material as the gate electrode 27 of the first thin film transistor T1. The driving circuit includes, but is not limited to, the gate driving circuit (GOA).

In the present embodiment, since the source electrodes 37 and drain electrode 38 of the second thin film transistor T2 and the gate electrode 27 of the first thin film transistor T1 are located in the same layer and made of the same material, the source electrodes 37 and drain electrode 38 of the second thin film transistor T2 and the gate electrode 27 of the first thin film transistor T1 may be simultaneously formed through one patterning process. Similarly, since the gate electrode of the second thin film transistor T2 and the light shielding layer 29 are located in the same layer and made of the same material, the gate electrode 35 of the second thin film transistor T2 and the light shielding layer 29 of the first thin film transistor T1 may be formed simultaneously through one patterning process, thereby reducing the number of process steps and reducing the manufacturing cost.

As a second aspect, an embodiment of the present disclosure provide a method for manufacturing a display substrate. The display substrate includes in a plurality of pixel units in a display region, and each of the plurality pixel units includes a first thin film transistor. The method includes steps S1 to S5.

At step S1, a base substrate is provided.

At step S2, a first semiconductor layer is formed on the base substrate. The first semiconductor layer includes an active layer of the first thin film transistor, and the active layer of the first thin film transistor at least includes a channel region and a drain contact region.

At step S3, an interlayer insulation layer is formed on a side of the first semiconductor layer away from the base substrate.

At step S4, a through hole is formed in the interlayer insulation layer through a patterning process.

At step S5, a first conductive layer is formed on a side of the interlayer insulation layer away from the first semiconductor layer; a pixel electrode is formed through a patterning process, such that the pixel electrode is directly and electrically connected to a drain contact region of the active layer of the first thin film transistor through a through hole penetrating through the interlayer insulation layer.

As compared with the prior art in which the pixel electrode is electrically connected to the active layer of the first thin film transistor through the transition electrode, in the embodiment in which the pixel electrode is directly and electrically connected to the drain contact region of the active layer of the first thin film transistor through the through hole penetrating through the interlayer insulation layer, the manufacture of the transition electrode can be omitted, the process steps can be simplied, and abnormal contact resistance tending to occur when the pixel electrode is connected to the transition electrode can be avoided.

The method for manufacturing the display substrate shown in FIG. 2 will be describe in detail below.

Figure 6A:
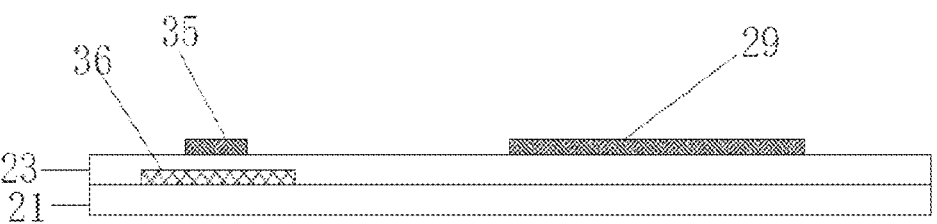
FIGS. 6a to 6g are schematic diagrams showing structures corresponding to steps of a method for manufacturing a display substrate according to an embodiment of the present disclosure.

At step S100, a glass base substrate is provided; a semiconductor layer is formed on the base substrate 21; and an active layer 36 of the second thin film transistor in the non-display region is formed through a patterning process. A first gate insulation layer 23 is formed on a side of the active layer 36 away from the base substrate 21. A conductive layer is formed on a side of the first gate insulation layer 23 away from the base substrate 21, and a gate electrode 35 of the second thin film transistor and a pattern of a light shielding layer 29 of the first thin film transistor in the display region are formed through a patterning process (as shown in FIG. 6a).

The active layer 36 of the second thin film transistor is made of polycrystalline silicon and has a thickness in a range from 300 Å to 600 Å. The gate electrode 35 of the second thin film transistor is made of Mo or other conductive metal and has a thickness in a range from 1000 Å to 6000 Å.

Figure 6B:
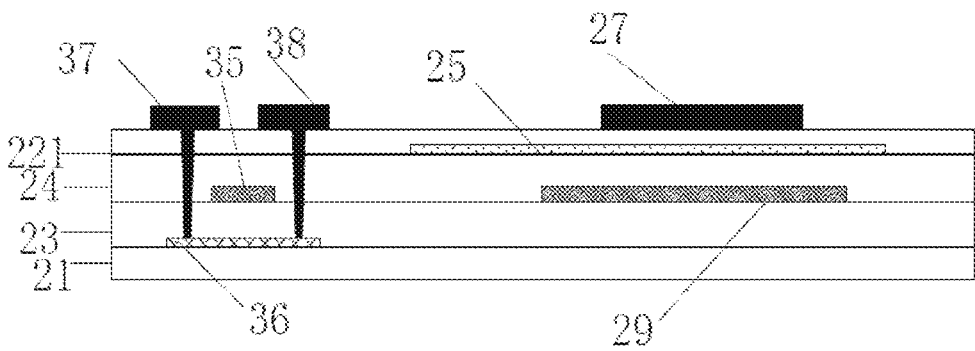

At step S101, a first interlayer insulation layer 24 is formed on a side of the gate electrode 35 of the second thin film transistor away from the base substrate 21. A semiconductor layer is formed on a side of the first interlayer insulation layer 24 away from the base substrate 21, and an active layer 25 of the first thin film transistor is formed through a patterning process. A second gate insulation layer 221 is formed on a side of the active layer 25 of the first thin film transistor away from the base substrate 21. A conductive layer is formed on a side of the second gate insulation layer 221 away from the base substrate 21, and a gate electrode 27 of the first thin film transistor and the source electrode 37 and the drain electrode 38 of the second thin film transistor are formed through a patterning process (as shown in FIG. 6b).

The material of the active layer 25 of the first thin film transistor includes IGZO, and IGZO can be a conventional component ratio of 1:1:1. Alternatively, the active layer 25 of the first thin film transistor may be a transparent oxide semiconductor with other component ratio of elements. The thickness of the active layer 25 of the first thin film transistor ranges from 200 Å to 1500 Å. The gate electrode 27 of the first thin film transistor and the source electrode 37 and the drain electrode 38 of the second thin film transistor are made of Mo, TiN\Mo, Ti/Al/Ti or other conductive materials, and may have single-layer or stacked-layer structure with a total thickness of 1000 Å to 7000 Å.

Figure 6C:
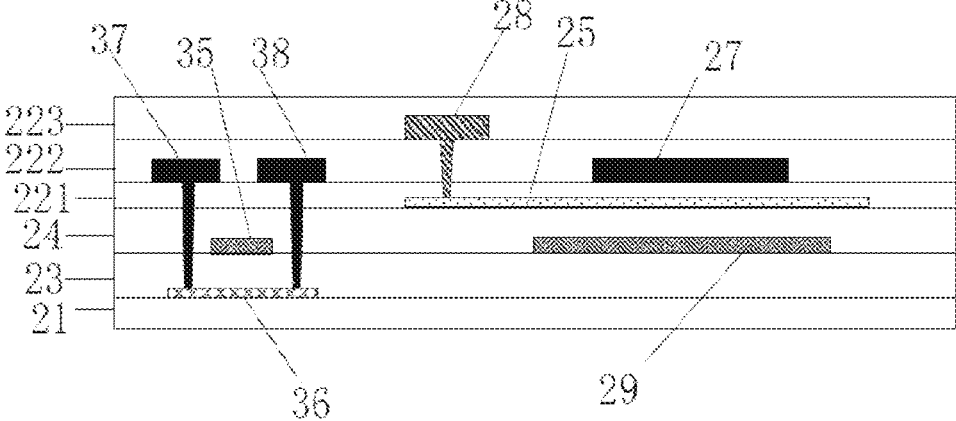

At step S102, a second insulation layer 222 is formed on a side of the gate electrode 27 of the first thin film transistor and the source electrode 37 and the drain electrode 38 of the second thin film transistor away from the base substrate 21. A conductive layer is formed on a side of the second insulation layer 222 away from the base substrate 21, and the source electrode 28 of the first thin film transistor is formed through a patterning process. A first passivation layer 223 is formed on a side of the source electrode 28 of the first thin film transistor away from the base substrate 21. The source electrode 28 of the first thin film transistor is made of Mo, TiN\Mo, Ti/Al/Ti, or other conductive materials, and may have a single-layer or stacked-layer structure with a total thickness in a range from 1000 Å to 6000 Å (as shown in FIG. 6c).

Figure 6D:
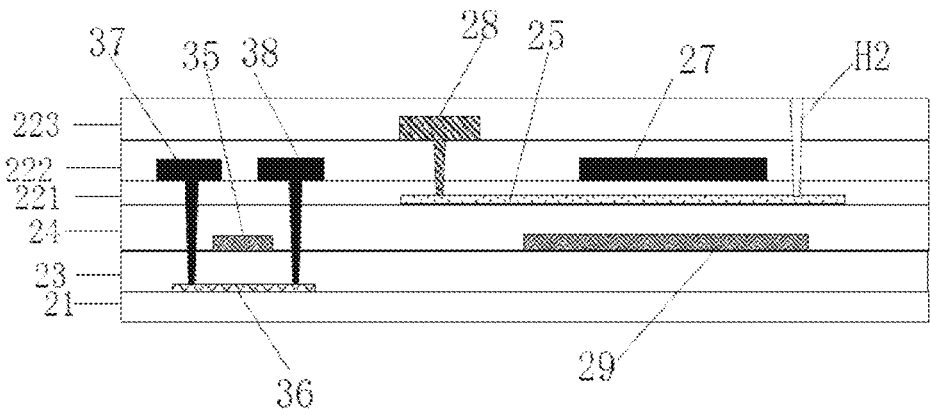
Figure 6E:
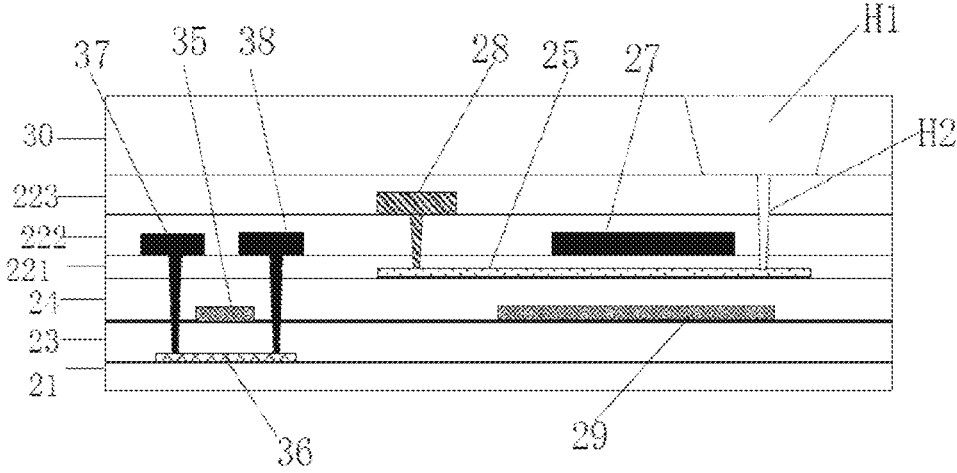

At step S103, a through hole H2 penetrating through the second gate insulation layer 221, the second insulation layer 222 and the first passivation layer 223 is formed through an etching process (as shown in FIG. 6d). Thereafter, a first planarization layer 30 is formed on a side of the first passivation layer 223 away from the base substrate 21, and a through hole H1 is formed through a patterning process at a position corresponding to the through hole H2. The depth of the through hole H1 ranges from 1 um to 3 um (as shown in FIG. 6e).

In some embodiments, on the basis of the step S102, the first planarization layer 30 is formed on a side of the first passivation layer 223 away from the base substrate 21, and then the through hole H1 and the through hole H2 are formed through one patterning process. Compared with step S103, the method can omit a mask, thereby reducing the manufacturing cost.

Figure 6F:
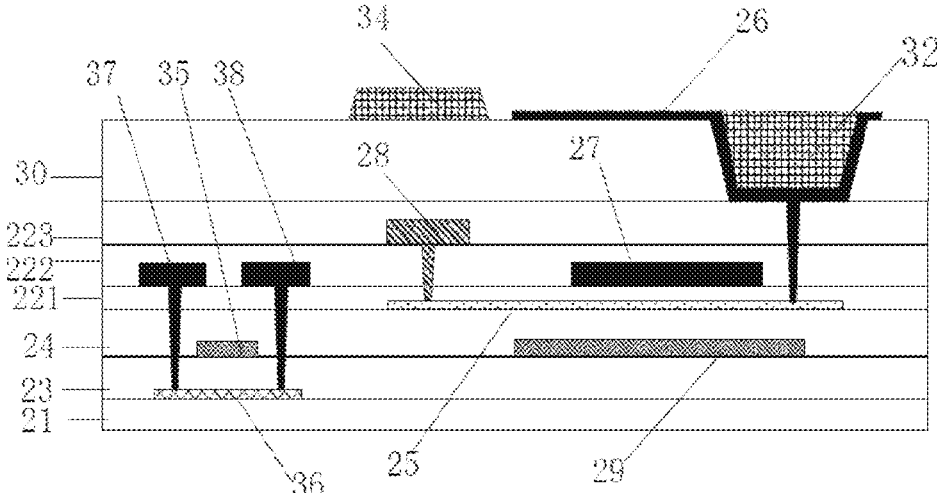

At step S104, a conductive layer is formed on a side of the first planarization layer 30 away from the base substrate, and the pixel electrode 26 is formed through a patterning process. Thereafter, a second planarization layer is formed on a side of the first planarization layer 30 away from the base substrate 21, and then a filling structure 32 (i.e., the filling structure) in the through hole H1 and a support structure 34 (i.e., the support structure) outside the pixel region are formed through one patterning process (as shown in FIG. 6f).

Figure 6G:
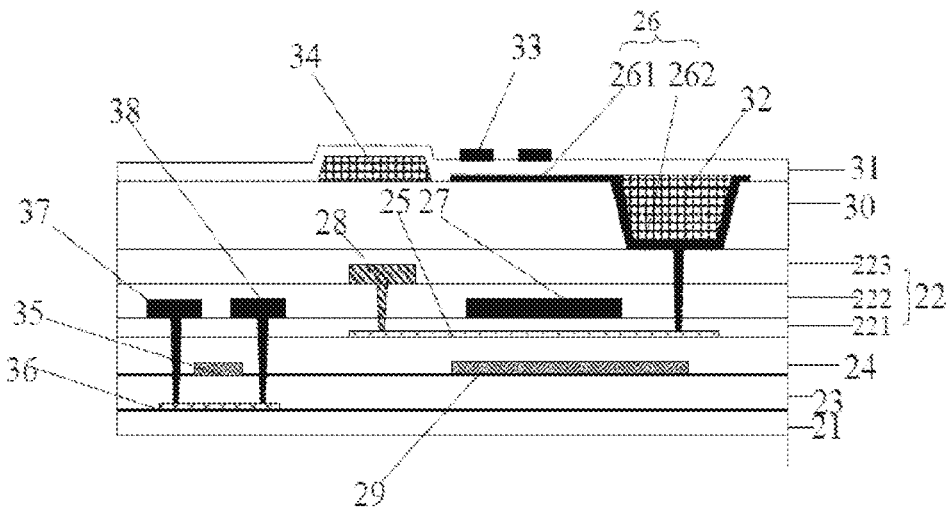

At step S105, a second passivation layer 31 is formed on a side of the support structure 34 away from the base substrate; a conductive layer is formed on a side of the second passivation layer 31 away from the base substrate 21; and a common electrode 33 is formed through a patterning process (as shown in FIG. 6g).

As compared with the prior art in which the pixel electrode is electrically connected to the active layer of the first thin film transistor through the transition electrode, in the embodiment in which the pixel electrode is directly and electrically connected to the drain contact region of the active layer of the first thin film transistor through the through hole penetrating through the interlayer insulation layer, the preparation of the transition electrode can be omitted, the process steps can be simplified, and the abnormal contact resistance tending to occur when the pixel electrode is connected to the transition electrode can be avoided. In addition, since the support structure 34 is not located in the pixel region, the light efficiency of the display panel can be improved.

As a third aspect, an embodiment of the present disclosure provides a display panel, which includes the display substrate described above. The display panel may be applied to any product or component having a display function, such as a mobile phone, a tablet computer, a television, a monitor, a notebook computer, a navigator, etc., but the embodiment of the present invention is not limited thereto.

It will be understood that the above embodiments are merely exemplary embodiments adopted to illustrate the principles of the present disclosure, and the present disclosure is not limited thereto. It will be apparent to one of ordinary skill in the art that various modifications and improvements can be made without departing from the spirit and essence of the present disclosure, and such modifications and improvements are also considered to be within the scope of the present disclosure.

What is claimed is:

1. A display substrate, having a display region, wherein the display substrate comprises:
   a base substrate;
   a plurality of pixel units in the display region on the base substrate, wherein each of the plurality pixel units comprises a first thin film transistor and a pixel electrode;
   an active layer of the first thin film transistor in a first semiconductor layer on the base substrate, and at least comprising a channel region and a drain contact region;

an interlayer insulation layer on a side of the first semiconductor layer away from the base substrate, wherein the interlayer insulation layer comprises a first insulation layer and a second insulation layer disposed in sequence on a side of the first semiconductor layer away from the base substrate;
   a data line in the first insulation layer and on a side of the first semiconductor layer away from the base substrate;
   a first through hole penetrating through the second insulation layer and a second through hole penetrating through the first insulation layer;
   a first conductive layer on a side of the second insulation layer away from the first insulation layer, wherein the pixel electrode is located in the first conductive layer, and the pixel electrode in the pixel unit is directly and electrically connected to the drain contact region of the active layer of the first thin film transistor through the first through hole and the second through hole, wherein
   the data line comprises a plurality of data line segments sequentially connected together, each of the plurality of data line segments comprises a first signal line sub-segment extending along a first direction, a second signal line sub-segment extending along a second direction and a third signal line sub-segment extending along a third direction, with the first direction, the second direction, and the third direction being different from each other, the third signal line sub-segment, the first signal line sub-segment and the second signal line sub-segment being sequentially connected,
   the active layer of the first thin film transistor comprises a first semiconductor structure extending along the first direction, a second semiconductor structure extending along a fifth direction, and a third semiconductor structure extending along the third direction, with the first direction, the fifth direction, and the third direction being different from each other and the third semiconductor structure, the first semiconductor structure and the second semiconductor structure being sequentially connected,
   an orthographic projection of the third signal line sub-segment of the data line on the base substrate overlaps an entirety of an orthographic projection of the third semiconductor structure of the active layer on the base substrate, an orthographic projection of the first signal line sub-segment of the data line on the base substrate overlaps an entirety of an orthographic projection of the first semiconductor structure of the active layer on the base substrate, and an orthographic projection of the second signal line sub-segment of the data line on the base substrate overlaps a portion of an orthographic projection of the second semiconductor structure of the active layer on the base substrate, and
   an orthographic projection of the first through hole on the base substrate overlaps with an orthographic projection of the second semiconductor structure on the base substrate.

2. The display substrate of claim 1, wherein an orthographic projection of the first through hole on the base substrate overlaps an orthographic projection of the second through hole on the base substrate.

3. The display substrate of claim 2, further comprising a third insulation layer comprising a filling structure and a support structure, wherein
   the filling structure is in the first through hole; and
   the support structure is on a side of the second insulation layer away from the base substrate.

4. The display substrate of claim 3, further comprising a second conductive layer and a third conductive layer, wherein the first insulation layer comprises a first insulation sub-layer, a second insulation sub-layer, and a third insulation sub-layer, the first insulation sub-layer is on a side of the first semiconductor layer away from the base substrate, the second conductive layer is on a side of the first insulation sub-layer away from the base substrate and comprises a gate line and a gate electrode of the first thin film transistor, the second insulation sub-layer is on a side of the second conductive layer away from the base substrate, the third conductive layer is on a side of the second insulation sub-layer away from the base substrate and comprises the data line and a source electrode of the first thin film transistor, and the third insulation sub-layer is on a side of the third conductive layer away from the base substrate.

5. The display substrate of claim 4, wherein the second signal line sub-segment and the third signal line sub-segment are connected to each other to form a first included angle therebetween, and the second signal line sub-segment and the third signal line sub-segment are located between two adjacent gate lines.

6. The display substrate of claim 5, wherein the first included angle is greater than or equal to 90° and less than 180°.

7. The display substrate of claim 3, wherein the pixel electrode comprises a first pixel sub-electrode and a second pixel sub-electrode electrically connected to the first pixel sub-electrode, the first pixel sub-electrode comprises a first portion and a second portion, wherein the first portion is in the first through hole and covers a sidewall and a bottom of the first through hole, and the second portion is filled in the second through hole and is connected to the drain contact region of the first thin film transistor, the second pixel sub-electrode is on a side of the second insulation layer away from the base substrate and is connected to the first portion of the first pixel sub-electrode.

8. The display substrate of claim 1, wherein the first semiconductor structure and the second semiconductor structure form a second angle therebetween, with the second angle being greater than or equal to 90° and less than 180°.

9. The display substrate of claim 1, further comprising a fourth insulation layer, a fifth insulation layer, and a fourth conductive layer disposed between the first semiconductor layer and the base substrate; wherein the fifth insulation layer is on a side of the first semiconductor layer proximal to the base substrate, the fourth conductive layer is on a side of the fifth insulation layer proximal to the base substrate, the fourth conductive layer comprises a light shielding layer, and an orthographic projection of the light shielding layer on the base substrate covers an orthographic projection of the channel region of the first semiconductor layer on the base substrate, and the fourth insulation layer is on a side of the fourth conductive layer proximal to the base substrate.

10. The display substrate of claim 9, wherein the display substrate further has a non-display region, and further comprises a gate driving circuit in the non-display region on the base substrate, and the gate driving circuit comprises a second thin film transistor, and a gate electrode of the second thin film transistor is in the fourth conductive layer.

11. The display substrate of claim 1, further comprising:

a sixth insulation layer on a side of the first conductive layer away from the base substrate, and a common electrode on a side of the sixth insulation layer away from the base substrate, wherein an orthographic projection of the common electrode on the base substrate overlaps an orthographic projection of the pixel electrode on the base substrate.

12. The display substrate of claim 1, wherein a material of the active layer of the first thin film transistor comprises an oxide semiconductor.

13. A display panel, comprising the display substrate of claim 1.

14. A method for manufacturing a display substrate, comprising:

providing a base substrate;

forming a plurality of pixel units in the display region on the base substrate, each of the plurality pixel units comprising a first thin film transistor and a pixel electrode;

forming an active layer of the first thin film transistor in a first semiconductor layer on the base substrate, with the active layer of the first thin film transistor at least comprising a channel region and a drain contact region;

forming a first insulation layer on the first semiconductor layer away from the base substrate;

forming a data line in the first insulation layer and on a side of the first semiconductor layer away from the base substrate;

forming a second through hole penetrating through the first insulation layer;

forming a second insulation layer on a side of the first insulation layer away from the base substrate;

forming a first through hole penetrating through the second insulation layer;

forming a first conductive layer on a side of the second insulation layer away from the first insulation layer, wherein the first conductive layer comprises the pixel electrode directly and electrically connected to the drain contact region of the active layer of the first thin film transistor through the first and second through holes, wherein forming the data line comprises: forming a plurality of data line segments sequentially connected together, such that each of the plurality of data line segments comprises a first signal line sub-segment extending along a first direction, a second signal line sub-segment extending along a second direction, and a third signal line sub-segment extending along a third direction, with the first direction, the second direction, and the third direction being different from each other, and the third signal line sub-segment, the first signal line sub-segment and the second signal line sub-segment being sequentially connected, forming the active layer of the first thin film transistor in the first semiconductor layer, comprises: forming a first semiconductor structure of the active layer extending along the first direction, a second semiconductor structure of the active layer extending along a fifth direction, and a third semiconductor structure of the active layer extending along the third direction, with the first direction, the fifth direction, and the third direction being different from each other, and the third semiconductor structure, the first semiconductor structure and the second semiconductor structure being sequentially connected, an orthographic projection of the third signal line sub-segment of the data line on the base substrate overlaps an entirety of an orthographic projection of the third semiconductor structure of the active layer on the base substrate, an orthographic projection of the first signal line sub-segment of the data line on the base substrate overlaps an entirety of an orthographic projection of the first semiconductor structure of the active layer on the base substrate, and an orthographic projection of the second signal line sub-segment of the data line on the base substrate overlaps a portion of an orthographic projection of the second semiconductor structure of the active layer on the base substrate, and an orthographic projection of the first through hole on the base substrate overlaps with an orthographic projection of the second semiconductor structure on the base substrate.

* * * * *